United States Patent
Lo

[19]

[11] Patent Number: 6,067,267
[45] Date of Patent: May 23, 2000

[54] FOUR-WAY INTERLEAVED FIFO ARCHITECTURE WITH LOOK AHEAD CONDITIONAL DECODER FOR PCI APPLICATIONS

[75] Inventor: John M. Lo, Fremont, Calif.

[73] Assignee: Toshiba America Electronic Components, Inc., Irvine, Calif.

[21] Appl. No.: 09/132,928

[22] Filed: Aug. 12, 1998

[51] Int. Cl.[7] .................................................. G11C 7/00
[52] U.S. Cl. ..................................... 365/221; 365/189.02
[58] Field of Search .............................. 365/221, 189.02, 365/189.01, 78, 240

[56] References Cited

U.S. PATENT DOCUMENTS

| | | | |
|---|---|---|---|
| 4,271,484 | 6/1981 | Peters et al. | 364/900 |
| 4,642,797 | 2/1987 | Hoberman | 365/221 |
| 4,888,739 | 12/1989 | Frederick et al. | 365/189.02 |
| 4,891,805 | 1/1990 | Fallin | 370/95.1 |
| 4,899,342 | 2/1990 | Potter et al. | 371/10.1 |
| 5,257,235 | 10/1993 | Miyamoto | 365/230.03 |
| 5,274,835 | 12/1993 | Wakatani | 395/800 |
| 5,311,519 | 5/1994 | Getzlaff et al. | 365/189.02 |
| 5,398,209 | 3/1995 | Iwakiri et al. | 365/221 |
| 5,440,550 | 8/1995 | Follett | 370/60 |
| 5,471,468 | 11/1995 | Sandin et al. | 370/60 |
| 5,544,101 | 8/1996 | Houston | 365/189.02 |
| 5,663,910 | 9/1997 | Ko et al. | 365/189.05 |
| 5,699,530 | 12/1997 | Rust et al. | 365/189.02 |
| 5,870,350 | 2/1999 | Bertin et al. | 365/189.02 |

*Primary Examiner*—Tan T. Nguyen
*Attorney, Agent, or Firm*—Limbach & Limbach L.L.P.

[57] ABSTRACT

A FIFO memory apparatus of the present invention includes an array of registers including a plurality of stacked subarrays. A first plurality of multiplexers is provided including one multiplexer for receiving data from each one of the subarrays. A second plurality of multiplexers is also provided each for receiving data from two other multiplexers. One of the second plurality of multiplexers supplies an output for the FIFO memory apparatus, while each of the others, in pairs, supply other multiplexers of the apparatus. The invention uses a four-way interleaved memory architecture for pre-decoding the FIFO read pointer and driving out data from one of the sixteen deep 32-bit wide registers, in advance. In this way, the final stage of the timing critical path is from the Q output of a toggle flip-flop to a two-to-one multiplexer and output buffer. This Q output of the toggle flip-flop is the least significant bit (LSB) of a four-bit counter used to select one of the 16-bit deep, 32-bit wide registers of the FIFO.

48 Claims, 6 Drawing Sheets

| CLOCK/MUX | STAGE 1 | | | | STAGE 2 | | STAGE 3 |
|---|---|---|---|---|---|---|---|
| | 10 | 12 | 14 | 16 | 18 | 20 | 22 |
| 1 | | | | 0 | | | |
| 2 | | 1 | | 0 | | | |
| 3 | | 1 | 2 | 0 | | 0 | |
| 4 | 3 | 1 | 2 | 0 | 1 | 0 | 0 |
| 5 | 3 | 1 | 2 | 4 | 1 | 2 | 1 |
| 6 | 3 | 5 | 2 | 4 | 3 | 2 | 2 |
| 7 | 3 | 5 | 6 | 4 | 3 | 4 | 3 |
| 8 | 7 | 5 | 6 | 4 | 5 | 4 | 4 |
| 9 | 7 | 5 | 6 | 8 | 5 | 6 | 5 |
| 10 | 7 | 9 | 6 | 8 | 7 | 6 | 6 |
| 11 | 7 | 9 | 10 | 8 | 7 | 8 | 7 |

FIG. 3

| TRDY/IRDY | F | $Q_3$ | $Q_2$ | $Q_1$ | $Q_0$ | CURP | B0RP | B1RP | B2RP | B3RP |
|---|---|---|---|---|---|---|---|---|---|---|
| 0 | | 0 | 0 | 0 | 0 | | 0 | 2 | 1 | 3 |
| 0 | | 0 | 0 | 0 | 0 | | 0 | 2 | 1 | 3 |
| 0 | | 0 | 0 | 0 | 0 | | 0 | 2 | 1 | 3 |
| 0 | | 0 | 0 | 0 | 0 | | 0 | 2 | 1 | 3 |
| 1 | | 0 | 0 | 0 | 0 | 0 | 0 | 2 | 1 | 3 |
| 1 | 1 | 0 | 0 | 0 | 1 | 1 | 0 | 2 | 1 | 3 |
| 1 | 1 | 0 | 0 | 1 | 0 | 2 | 4 | 2 | 1 | 3 |
| 1 | 1 | 0 | 0 | 1 | 1 | 3 | 4 | 2 | 5 | 3 |
| 1 | 1 | 0 | 1 | 0 | 0 | 4 | 4 | 6 | 5 | 3 |
| 1 | 1 | 0 | 1 | 0 | 1 | 5 | 4 | 6 | 5 | 7 |
| 1 | 1 | 0 | 1 | 1 | 0 | 6 | 8 | 6 | 5 | 7 |
| 1 | 1 | 0 | 1 | 1 | 1 | 7 | 8 | 6 | 9 | 7 |
| 1 | 1 | 1 | 0 | 0 | 0 | 8 | 8 | 10 | 9 | 7 |
| 1 | 1 | 1 | 0 | 0 | 1 | 9 | 8 | 10 | 9 | 11 |
| 1 | 1 | 1 | 0 | 1 | 0 | 10 | 12 | 10 | 9 | 11 |
| 1 | 1 | 1 | 0 | 1 | 1 | 11 | 12 | 10 | 13 | 11 |
| 1 | 1 | 1 | 1 | 0 | 0 | 12 | 12 | 14 | 13 | 11 |
| 1 | 1 | 1 | 1 | 0 | 1 | 13 | 12 | 14 | 13 | 15 |
| 1 | 1 | 1 | 1 | 1 | 0 | 14 | 0 | 14 | 13 | 15 |
| 1 | 1 | 1 | 1 | 1 | 1 | 15 | 0 | 14 | 1 | 15 |
| 1 | 1 | 0 | 0 | 0 | 0 | 0 | 0 | 2 | 1 | 15 |
| 1 | 1 | 0 | 0 | 0 | 1 | 1 | 0 | 2 | 1 | 3 |
| 1 | 1 | 0 | 0 | 1 | 0 | 2 | 4 | 2 | 1 | 3 |
| 0 | 1 | 0 | 0 | 1 | 1 | 3 | 4 | 2 | 5 | 3 |
| 0 | 0 | 0 | 0 | 1 | 1 | 3 | 4 | 6 | 5 | 3 |
| 0 | 0 | 0 | 0 | 1 | 1 | 3 | 4 | 6 | 5 | 3 |
| 0 | 0 | 0 | 0 | 1 | 1 | 3 | 4 | 6 | 5 | 3 |
| 0 | 0 | 0 | 0 | 1 | 1 | 3 | 4 | 6 | 5 | 3 |
| 1 | 0 | 0 | 0 | 1 | 1 | 3 | 4 | 6 | 5 | 3 |
| 1 | 1 | 0 | 1 | 0 | 0 | 4 | 4 | 6 | 5 | 3 |
| 1 | 1 | 0 | 1 | 0 | 1 | 5 | 4 | 6 | 5 | 7 |
| 1 | 1 | 0 | 1 | 1 | 0 | 6 | 8 | 6 | 5 | 7 |
| 1 | 1 | 0 | 1 | 1 | 1 | 7 | 8 | 6 | 9 | 7 |
| 1 | 1 | 1 | 0 | 0 | 0 | 8 | 8 | 10 | 9 | 7 |
| 1 | 1 | 1 | 0 | 0 | 1 | 9 | 8 | 10 | 9 | 11 |
| | | | | | | | | | | |

FIG. 5

FOUR-WAY INTERLEAVED FIFO ARCHITECTURE WITH LOOK AHEAD CONDITIONAL DECODER FOR PCI APPLICATIONS

BACKGROUND OF THE INVENTION

1. Field of the Invention

The present invention relates to FIFO (first-in, first-out) architecture, and particularly to an interleaved FIFO memory array with look ahead conditional decoder for PCI applications.

2. Discussion of the Related Art

It is known to decode a FIFO to selectively advance particular entries in a FIFO to an output. Using a four-way interleaving architecture for performing this task is also known. An example is shown schematically in FIG. 1. U.S. Pat. No. 5,663,910 to Ko et al. (hereinafter "Ko et al.") substantially discloses the FIFO architecture shown in FIG. 1 and described below.

The FIFO of FIG. 1 is represented schematically as four subarrays of four registers, wherein each register can store 32 bits of data. This schematic arrangement is conceptual. Physically, the array including four subarrays is a single FIFO comprising 16 registers, each having 32 bits. The four subarrays are distinguished conceptually by pointer manipulation.

Each of the four subarrays of four registers of the architecture of FIG. 1 is supplied to a (different) multiplexer to which two-bit signals are supplied (hereinafter "two-bit multiplexer"). Different two-bit signals supplied to each two-bit multiplexer control the selection of one of the four registers from the subarray associated with the two-bit multiplexer to be supplied as the output thereof. That is, the two-bit signal dictates from which one of the four registers that 32-bit information located at current pointer addresses of that register will be read and supplied to the two-bit multiplexer to be output therefrom.

Each of the four two-bit multiplexers is supplied to a fifth two bit multiplexer having four inputs, one for each of the four two-bit multiplexers from which the fifth two-bit multiplexer receives input data. A two-bit signal is applied to the fifth two-bit multiplexer to control from which one of the four input two-bit multiplexers information is to be currently and/or next received. The "four-way interleaving" component of the FIFO architecture of FIG. 1 is realized when both data and control signals are interleaved to achieve the task of decoding the FIFO and selectively advancing entries for each of four conceptual subarrays of registers via four separate data paths initiated through the four two-bit multiplexers each configured to receive data from one of the four subarrays.

Use of the fifth two-bit multiplexer for receiving input directly from each of the first four two-bit multiplexers configured to receive information from its associated one of the four FIFO stacks becomes problematic at sufficiently high processing speeds. In fact, the disclosure of Ko et al. only appears to contemplate input FIFOs capable of receiving an input data stream having a frequency of 100 Mhz. See col. 6, lines 11–13; col. 7, lines 27–28. Thus, the disclosure of Ko et al. only provides an architecture (see FIG. 1A) which allows an input data stream having a frequency of 100 Mhz to be de-interleaved and written into SRAM memory blocks. See col. 7, lines 33–35.

The fifth two-bit multiplexer of FIG. 1 is encumbered with the task of conceptually selecting one of sixteen, 32-bit wide registers. A problem is that the fifth multiplexer of FIG. 1, and as disclosed in Ko et al., does not hold information received by each of the first four two-bit multiplexers, e.g., for four clock cycles before outputting the information in turn. The fifth multiplexer merely serves conceptually as a sixteen to one multiplexer.

It is desired to have signals clocked out at each clock cycle. Moreover, it is desired to avoid the complications of using the fifth two-bit multiplexer of FIG. 1, with its wide data path, and its inherent associated delay.

SUMMARY OF THE INVENTION

A FIFO memory apparatus of the present invention comprises an array of registers including a plurality of stacked subarrays. A first plurality of multiplexers is provided including one multiplexer for receiving data from each one of the subarrays. A second plurality of multiplexers is also provided each for receiving data from two other multiplexers. One of the second plurality of multiplexers supplies an output for the FIFO memory apparatus, while each of the others, in pairs, supply other multiplexers of the apparatus.

A FIFO memory according to the present invention may be divided into first and second FIFO stacks including first and second subarrays of registers, and third and fourth subarrays of registers, respectively. First, second, third and fourth multiplexers for receiving output from the first, second, third and fourth subarrays, respectively, and for outputting the same, is then next provided. A fifth multiplexer is connected to each of the first and second multiplexers and receives output from the first FIFO stack via the first and second multiplexers. A sixth multiplexer is connected to each of the third and fourth multiplexers and receives output from the second FIFO stack via the third and fourth multiplexers. A seventh multiplexer is then connected to each of the fifth and sixth multiplexers and receives output from both the first and second FIFO stacks via the fifth and sixth multiplexers, respectively. The seventh multiplexer then supplies an output for the FIFO memory.

In accord with the present invention, a FIFO memory comprises a first and a second FIFO memories. A first pair of multiplexers receive output from the first FIFO memory, and a second pair of multiplexers receive output from the second FIFO memory. A third pair of multiplexers is next provided, wherein one multiplexer of the third pair receives the output of the first pair and the other multiplexer of the third pair receives the output of the second pair. A single-bit output multiplexer receives an output from each one of the third pair of multiplexers, alternately, and supplies an output for the FIFO memory.

In further accordance with the present invention, a FIFO architecture comprises a plurality of data banks each including a plurality of registers having data stored therein, and a plurality of read pointers each associated with a different data bank and pointing to a first register of its associated data bank. A first read pointer changes to point to a second register of its associated data bank after a first clock cycle, and data stored in one of the registers of a first data bank is output also during the first clock cycle.

The first read pointer changes to point to the second register after having pointed to the first register for more than one clock cycle. The number of clock cycles that the first read pointer points to the first register before changing to point to the second register is preferably equal to a total number of read pointers. That total number is preferably four.

A second read pointer changes to point to a second register of its associated data bank after a second clock cycle, and data stored in one of the registers of a second data bank is output during the second clock cycle. A third read pointer changes to point to a second register of its associated data bank after a third clock cycle, and data stored in one of the registers of a third data bank is output during the third clock cycle. A fourth read pointer changes to point to a second register of its associated data bank after a fourth clock cycle, and data stored in one of the registers of a fourth data bank is output during the fourth clock cycle.

A method of decoding a FIFO memory array using a plurality of multiplexers includes the steps of arranging the array into a plurality of subarrays and all but one of the plurality of multiplexers into pairs of multiplexers, wherein the one not arranged with another multiplexer into a pair supplies an output for the FIFO array. The method further includes outputting each subarray to one of the plurality of multiplexers and each pair of multiplexers to a different one of the plurality of multiplexers.

BRIEF DESCRIPTION OF THE DRAWINGS

FIG. 3 shows a clocking scheme for the arrangement of FIG. 2.

FIG. 5 is a clocking scheme for the arrangement of FIG. 4A.

DETAILED DESCRIPTION OF THE PREFERRED EMBODIMENT

In the PCI 2.1 specification, it is stated that only a three nanosecond (ns) time period is allowed for advancing an outbound FIFO read pointer (four-bit) to its next location with a timing critical path from an input pin (10 pf loading) through an input buffer to internal logic. The PCI 2.1 specification further states that only a six ns time period is allowed for decoding the FIFO read pointer and then driving out one of the 32-bit wide data strings from a register of the 16 deep FIFO through decoder multiplexers and then to the output to package pins with 80 pf loading on each pin.

The present invention uses a four-way interleaved memory architecture for pre-decoding the read pointer and driving out the data from one of the sixteen deep 32-bit wide registers in advance. In this way, the final stage of the timing critical path is from the Q output of a toggle flip-flop to a two-to-one multiplexer and output buffer. This Q output of the toggle flip-flop is the least significant bit (LSB) of a four-bit counter used to select one of the 16-bit deep, 32-bit wide registers of the FIFO. The invention includes a new way to architect a circular FIFO such that it can meet the PCI 2.1 specification's 66 MHz, 32-bit wide data path timing requirement.

Figure 2:
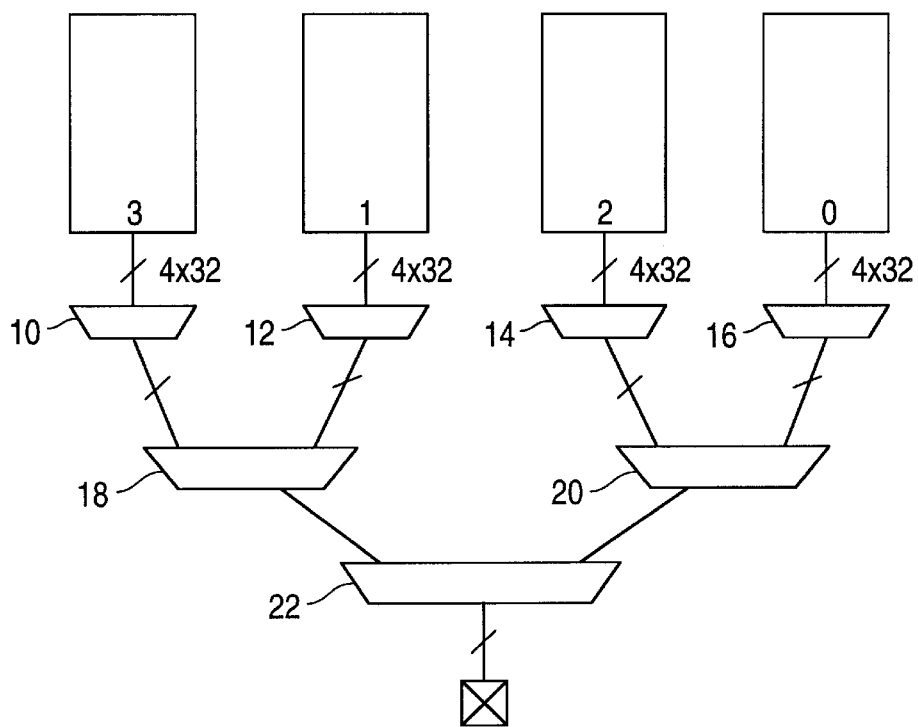
FIG. 2 shows a schematic arrangement of a FIFO architecture according to the present invention.

FIG. 2 shows, from left to right, a first subarray 3, a second subarray 1, a third subarray 2 and a fourth subarray 0. Each of the subarrays is shown in block form schematically in FIG. 2. Physically, however, an array of sixteen registers each having 32-bits is provided. Therefore, the schematic configuration of FIG. 2 includes four subarrays 3, 1, 2 and 0 wherein each subarray 3, 1, 2 and 0 includes four registers having 32-bits each.

The sixteen registers are arranged in an order prescribed for efficient ordering of read/write pointer(s) associated with the array. That is, the first subarray 3 includes registers 3, 7, 11 and 15. The second subarray 1 includes registers 1, 5, 9 and 13. The third subarray 2 includes registers 2, 6, 10 and 14. The fourth subarray 0 includes registers 0, 4, 8 and 12. As a result of this arrangement, the first and second subarrays 3 and 1 define an odd subarray and each of the third and fourth subarrays 2 and 0 define an even subarray.

Each of the first subarray 3, the second subarray 1, the third subarray 2 and the fourth subarray 0 is connected to an independent associated multiplexer. That is, the first subarray 3 is connected to a first multiplexer 10. The second subarray 1 is connected to a second multiplexer 12. The third subarray 2 is connected to a third multiplexer 14. The fourth subarray 0 is connected to a fourth multiplexer 16. Each of multiplexers 10, 12, 14 and 16 is preferably a two-bit multiplexer. The four registers of each subarray 3, 1, 2 and 0, are supplied to each of the two-bit multiplexers 10, 12, 14 and 16, respectively.

A read pointer of each multiplexer 10, 12, 14 and 16 selects the order by which the four registers of its associated subarray 3, 1, 2 and 0, respectively, will be read from. For example, a read pointer of the first multiplexer 10 might first read data from register 3, then from register 7, then from register 11, then from register 15, then again from register 3, and so on. In this example, when register 3 is read the second time, new data may be located there, after having been written into register 3, after register 3 was read the first time. The four multiplexers 10, 12, 14 and 16 are two-bit multiplexers as each selects from which one of the four registers of its associated subarray 3, 1, 2 or 0 it will next receive and/or output data. The read pointer of each multiplexer 10, 12, 14 and 16, is a two bit signal, selecting one of the four registers supplied thereto from the associated subarray.

Data stored in each of the four registers of each subarray 3, 1, 2 and 0 is held for four clock cycles as the read pointer cycles through the four registers in the prescribed order. Each multiplexer 10, 12, 14 and 16 may receive and/or output data from one of the four registers once every four clock cycles, as controlled by periodic rising and/or falling edges of the respective internal clocks of the two-bit multiplexers 10, 12, 14 and 16, and as ultimately controlled by an external control signal and an input data flow.

As mentioned above, the subarrays 3, 1, 2 and 0 are conceptually divided among an even subarray and an odd subarray of the total array. The odd subarray comprises subarrays 3 and 1, while the even subarray comprises subarrays 2 and 0. The first and second multiplexers 10 and 12 preferably receive data only from registers (1, 3, . . . 15) of the odd subarray, while the third and fourth multiplexers 14 and 16 preferably receive data only from registers (0, 2, . . . 14) of the even subarray.

The outputs of the first and second multiplexers 10 and 12 are supplied to a fifth multiplexer 18. The fifth multiplexer 18 is preferably a single-bit multiplexer for receiving input from only two sources, i.e., the first and second multiplexers 10 and 12. An internal clock of the fifth multiplexer 18 and a two-bit external control signal control the selection of data input and the periodic rate at which the fifth multiplexer 18 receives data from the first and second multiplexers 10 and 12. Data may be received and/or output by the fifth multiplexer 18 at rising and/or falling edges of the internal/external clock signals. Data may be received and/or output from each of the first and second multiplexers 10 and 12 supplying the fifth multiplexer 18 once every two clock cycles. Thus, the fifth multiplexer 18 serves as a common input/output point for all data received by and read from registers of the odd subarray to be ultimately supplied as output of the complete FIFO.

The output of the third and fourth multiplexers 14 and 16 are supplied to a sixth multiplexer 20. The sixth multiplexer 20 is preferably a single-bit multiplexer for receiving input from only two sources, i.e., the third and fourth multiplexers 14 and 16. An internal clock of the sixth multiplexer 20 and a single-bit external control signal control the selection of data input and the periodic rate at which the sixth multiplexer 20 receives data from the third and fourth multiplexers 14 and 16. Data may be received and/or output by the sixth multiplexer 20 at rising and/or falling edges of the internal/external clock signals. Data may be received and/or output from each of the third and fourth multiplexers 14 and 16 supplying the sixth multiplexer 20 once every two clock cycles. Thus, the sixth multiplexer 18 serves as a common input/output point for all data received by and read from registers of the even subarray to be ultimately supplied as output of the complete FIFO.

Each of the fifth multiplexer 18 and the sixth multiplexer 20 is connected to a seventh multiplexer 22. The seventh multiplexer 22 is preferably a single-bit multiplexer for receiving input from only two sources, i.e., the fifth multiplexer 18 and the sixth multiplexer 20. An internal clock of the seventh multiplexer 22 and a single-bit external control signal control the selection of data input and the periodic rate at which data is received and/or output by the seventh multiplexer 22. Data may be received by the seventh multiplexer 22 from each of the fifth and sixth multiplexers 18 and 22, every two clock cycles. Data may be supplied from the seventh multiplexer as output of the complete FIFO every clock cycle.

FIG. 3 is a clocking scheme for the arrangement of FIG. 2. The clocking scheme of FIG. 3 shows how data from each of the four subarrays 3, 1, 2 and 0 is received by and output from each of the four multiplexers 10, 12, 14 and 16 of "stage 1" of the decoding scheme of the arrangement of the first embodiment of FIG. 2. During a first clock cycle, a 32-bit data string is initially received from register 0 of the fourth subarray 0 of the even subarray as output by the fourth multiplexer 16. At a second clock cycle, data initially received from register 1 of the second subarray 1 of the odd subarray as output to the second multiplexer 12, is output by the second multiplexer 12. At clock cycle 3, data initially received from register 2 of the third subarray 2 of the even subarray as output to the third multiplexer 14, is output by the third multiplexer 14. At clock cycle 4, data initially received from register 3 of the first subarray 3 of the odd subarray as output to the first multiplexer 10, is output by the first multiplexer 10. At clock cycle 5, the four clock cycle period of stage 1 repeats with data initially received from registers 4-7.

The clocking scheme of FIG. 3 next shows how data from each of the first four multiplexers 10, 12, 14 and 16 is received by and output from each of the two multiplexers 18 and 20 of "stage 2" of the decoding scheme of the arrangement of the first embodiment of FIG. 2. At clock cycle 3, data which was earlier received from register 0 and output by the fourth multiplexer 16 to the sixth multiplexer 20, is output from the sixth multiplexer 20. Note that just as this data was received by register 0 before other data received by other registers of the array, such as that subsequently stored at register 1, e.g., this data was also supplied to a stage 1 multiplexer, i.e., 16, a stage 2 multiplexer, i.e., 20, and now to a stage 3 multiplexer, i.e., 22, before any such supply of such other data, e.g., that of register 1, occurs. At clock cycle 4, data which was earlier received from register 1 and received from the second multiplexer 12 by the fifth multiplexer 18, is output from the fifth multiplexer 18. At clock cycle 5, the two clock period cycle of stage 2 repeats with data initially stored at registers 2 and 3, rather than at registers 0 and 1.

The clocking scheme of FIG. 3 next shows how data is received by each of the stage 2 multiplexers 18 and 20 and output from each of the stage 2 multiplexers 18 and 20 of the decoding scheme of the arrangement of the first embodiment of FIG. 2, and received by the seventh multiplexer 22 of stage 3, for output by the seventh multiplexer 22 of stage 3. At the fourth clock cycle, data initially stored at register 0 is supplied by multiplexer 22 as output of the complete FIFO. At clock cycle 5, data initially stored at register 1 is supplied by multiplexer 22 as output of the complete FIFO, etc.

In summary with respect to the FIFO arrangement of FIG. 2, an array of 16 registers each with 32 bits is provided. Each of four subarrays 3, 1, 2 and 0 is supplied to a one of four two-bit deep multiplexers 10, 12, 14 or 16, which selects one of the registers as an output thereof. Thus, collectively each of the multiplexers 10, 12, 14 and 16 receives 4×32 bit signals and based upon two-bit control signals supplied thereto outputs a 32-bit signal. Each of the outputs of multiplexers 10, 12, 14 and 16 is supplied to a single-bit multiplexer 18 or 20. The single-bit multiplexer 18 or 20 selects one of two 32-bit wide single bit strings as output. The output of the single bit multiplexer 18 or 20 is then supplied to a third stage single-bit multiplexer 22 which supplies an output of the FIFO.

Figure 1:
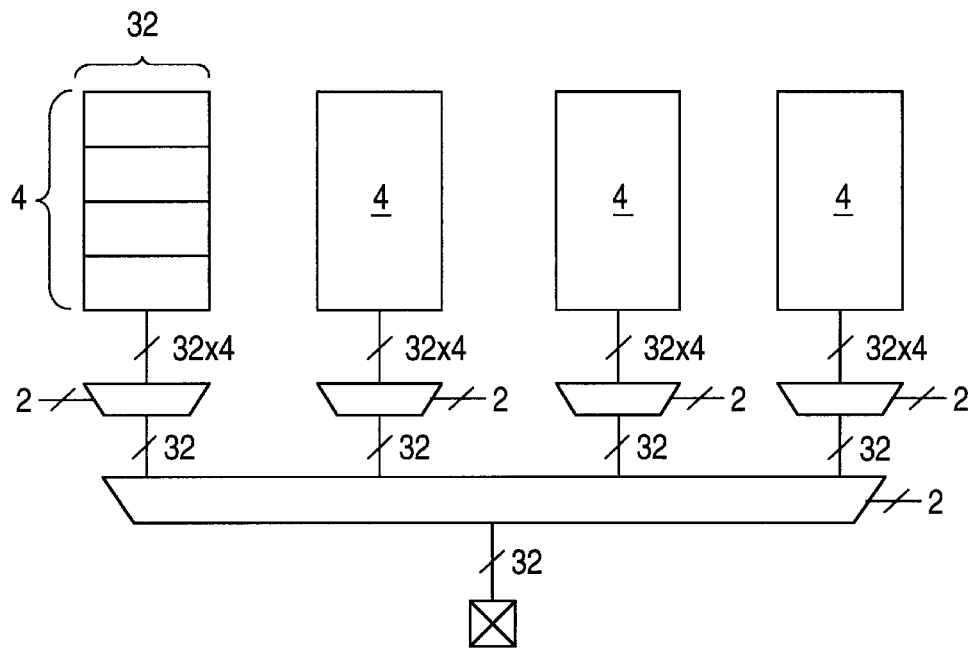
FIG. 1 shows a schematic arrangement of a FIFO architecture of the prior art.

The present invention is more than a rearrangement of the multiplexers of the decoding scheme of FIG. 1. It also includes an arrangement of the timing such that appropriate signals from the appropriate subarrays 3, 1, 2 and/or 0 are delayed, thereby providing the ability to output from the seventh multiplexer 22 a 32-bit signal with each clock signal supplied to the seventh multiplexer 22.

During the first clock pulse, the fourth multiplexer 16 is switched so that signals from register 0 are supplied as the output of the fourth multiplexer 16. At the second clock pulse, the signal to the fourth multiplexer 16 is such that the output of register 0 continues as the output of the fourth multiplexer 16. At the same time, control signals are supplied to the second multiplexer 12 to read out the output of register 1. From the clocking scheme of FIG. 3, it is seen that this continues until the third clock signal, at which point a control signal supplied to the sixth multiplexer 20 is activated to supply the contents of register 0 as an output of the sixth multiplexer 20. At the fourth clock signal, both the fifth and sixth multiplexers 18 and 20 are activated so that an output of the fifth multiplexer 18 is register 1 and the output of the sixth multiplexer 20 is register 0. This permits in the fifth clock signal for the seventh multiplexer 22 to output the data stored initially at register 0. However, since the data from register 1 is still at the fifth multiplexer 18, during the sixth clock signal, the seventh multiplexer 22 can be activated so that its output can be from register 1.

The signals at stage 1, or for each of the multiplexers 10, 12, 14 and 16, are maintained for four clock periods. Data signals held at each of the multiplexers in stage 2, or at each of the multiplexers 18 and 20, are maintained for two clock periods. Data signals held at the sole multiplexer in stage 3, or the seventh multiplexer 22, are maintained for only one clock period.

Figure 4A:
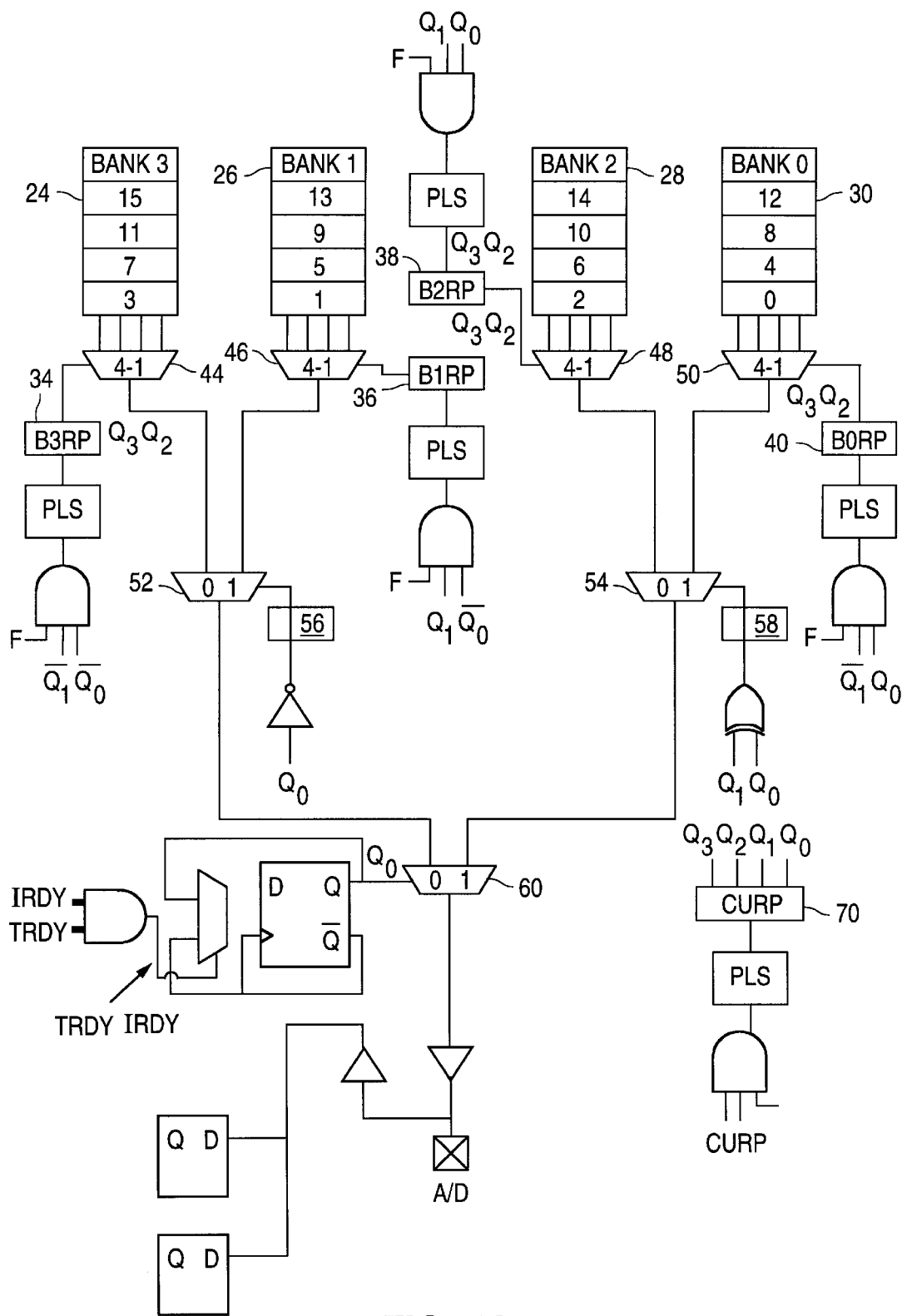
FIG. 4A shows a preferred arrangement of a FIFO architecture according to the present invention.
Figure 4B:
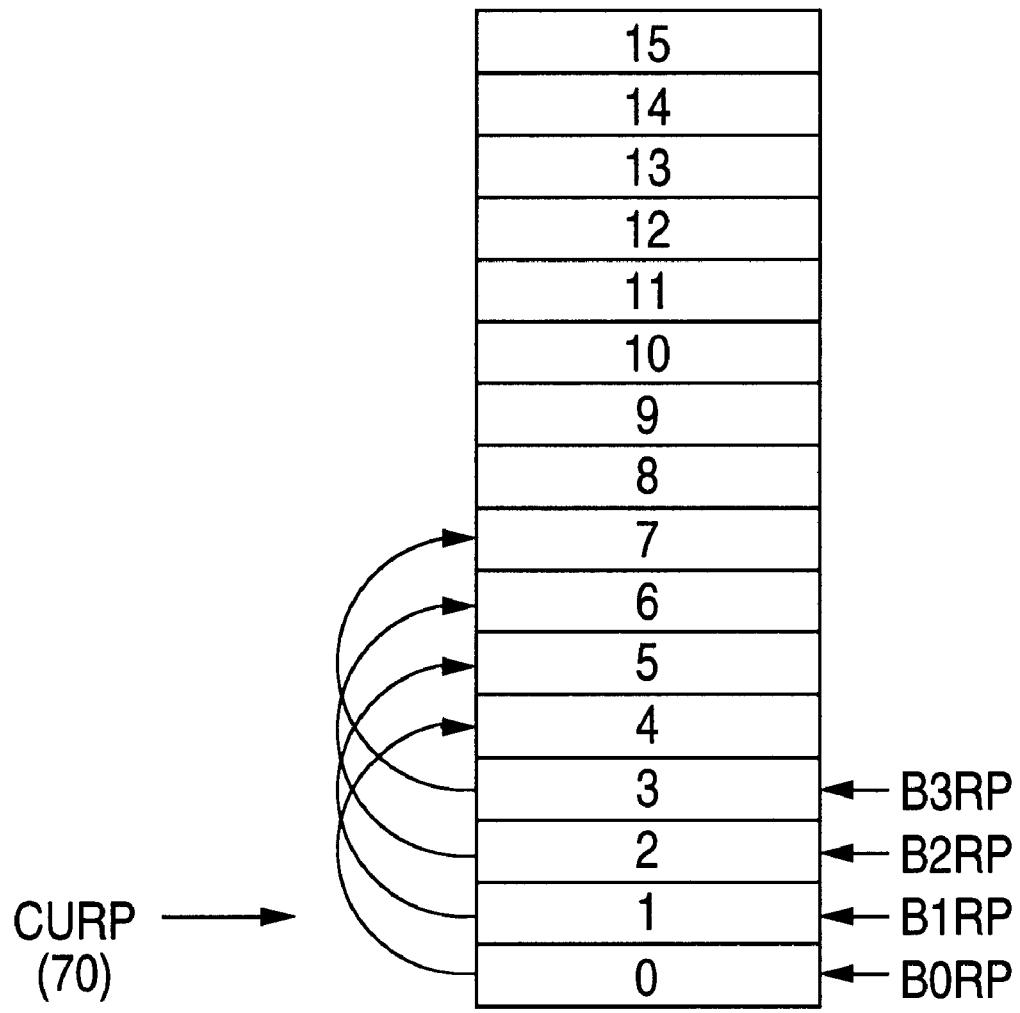
FIG. 4B shows conceptually how the current read pointer changes every clock cycle while each of four bank read pointers change every four clock cycles.

FIGS. 4A, 4B and 5 show an arrangement and a clocking scheme of a FIFO architecture according to a second embodiment of the present invention. The 16-bit deep, 32-bit wide FIFO of FIG. 4A is divided into four banks of registers, i.e., bank three 24, bank two 28, bank one 26, and bank zero 30. Each bank 24, 26, 28 and 30 has a two-bit wide bank pointer 34, 36, 38 and 40, respectively, associated with it which is used to select one of four, 32-bit wide bank registers. Bank zero 30 includes the zeroeth, fourth, eighth and twelfth registers. Bank one 28 includes the first, fifth, ninth and thirteenth registers. Bank two 26 includes the second, sixth, tenth and fourteenth registers. Bank three 24 includes the third, seventh, eleventh and fifteenth registers.

Each bank read pointer 34, 36, 38 and 40 increments to the next of the four registers of its associated bank 24, 26, 28 and 30, respectively, once every four clock cycles. Each bank read pointer 34, 36, 38 and 40 increments at one value of the two bit combination $Q_1Q_0$. For example, the incrementing of the bank zero read pointer (BORP) 40 is triggered by a signal from a PLS generator when $Q_1Q_0=01$, that of the bank one read pointer (B1RP) 36 at $Q_1Q_0=10$, that of the bank two read pointer (B2RP) 38 at $Q_1Q_0=11$, and that of the bank three read pointer (B3RP) 34 at $Q_1Q_0=00$. The flip-flop output F is the $Q_0$ also featured in FIG. 4A, and is controlled by a Trdylrdy signal. F, or $Q_0$, is high whenever any of the AND gates triggers a PLS generator to supply a signal to its associated bank read pointer 34, 36, 38 or 40 to increment, when the decoder is also enabled to supply its output. The flip-flop output F is preferably part of a $Q_0Q_1$ counter external to but connected with the FIFO of the present invention.

Referring to FIG. 4B, the current read pointer (CURP) 70 changes at every clock cycle among the four bank read pointers 34, 36, 38 and 40. It is seen how the bank read pointers 34, 36, 38 and 40 change every four clock cycles while the CURP 70 changes every clock cycle.

The clocking scheme of FIG. 5 shows the Trdylrdy signal initially set low, or at "0". At the fifth clock cycle shown, the Trdylrdy signal goes high, or to "1". The current read pointer CURP, which is 0, is then read. Thus, the 32-bit data string of the zeroeth register (of bank zero 30) is supplied as an output of the decoder. As long as the Trdylrdy signal remains high, the CURP moves to another register at each clock signal, as shown in FIG. 5. So, at the sixth clock cycle, $Q_0$ goes high, CURP goes to 1 and the first register is output. At the seventh clock signal, $Q_1$ goes high, $Q_0$ goes low, CURP goes to 2 and the second register is output.

The decoder continues to output and increment at each clock cycle as shown in FIG. 5, when the Trdylrdy signal is high. At the twenty-fourth clock signal shown in FIG. 5, the Trdylrdy signal goes low for five clock cycles, during which time none of the read pointers of the decoder increments and the output of the decoder is fixed at data stored in the third register. When the Trdylrdy signal goes low, the read pointer does not increment because the external device is not ready to read data. In this way, the Trdylrdy signal functions as a count enable signal.

The values of the most significant bits, $Q_3$ and $Q_2$, and the least significant bits, $Q_1$ and $Q_0$, shown in FIG. 5, determine which bank, 24, 26, 28 or 30, is the current bank and which of the four registers of the current bank 24, 26, 28 or 30 is to be output from the current bank 24, 26, 28 or 30. The current bank is determined by the values of the least significant bits $Q_0$ and $Q_1$, which are shared by the four banks 24, 26, 28 and 30. Each of the four banks 24, 26, 28 and 30 will decode its own $Q_3Q_2$ and its own special pattern to increment to the next count. That is, bank zero 30 uses $\overline{Q}_1$ and $Q_0$ as the condition to increment BORP 40 $Q_3$ and $Q_2$. Bank one 26 uses $Q_1$ uses $\overline{Q}_0$ as the condition to increment B1RP 36 $Q_3$ and $Q_2$. Bank two 28 uses $Q_1$ and $Q_0$ as the condition to increment B2RP $Q_3$ and $Q_2$. Bank three 24 uses $\overline{Q}_1$ and $\overline{Q}_0$ as the condition to increment B3RP $Q_3$ and $Q_2$. As a consequence, each of the four banks 24, 26, 28 and 30 increments at a different time.

Referring to FIG. 5, while each bank read pointer 40, 36, 38 and 34 $Q_3Q_2=00$, each of the zeroeth, first, second and third registers is, respectively, output at $Q_1Q_0=01$, 10, 11, and 00. Then, when each bank read pointer 40, 36, 38 and 34 $Q_3Q_2=01$, each of the fourth, fifth, sixth and seventh registers is, respectively, output at $Q_1Q_0=01$, 10, 11 and 00. Next, when each bank read pointer 40, 36, 38 and 34 $Q_3Q_2$10, each of the eighth, ninth, tenth and eleventh registers is, respectively, output at $Q_1Q_0=01$, 10, 11 and 00. Last, when each bank read pointer 40, 36, 38 and 34 $Q_3Q_2=11$, each of the twelfth, thirteenth, fourteenth and fifteenth registers is, respectively, output at $Q_1Q_0=01$, 10, 11 and 00.

As shown in FIG. 5, on every clock cycle that Trdylrdy is high, one of the register banks changes its read pointer value. The output of the bank corresponding to this read pointer value thus changes. In this way, each bank register is output to its associated multiplexer 44, 46, 48 or 50 for four clock cycles. However, each of these four cycle periods is offset to correspond to a different time. Thus, the signals from the outputs of the register banks 24, 26, 28 and 30 are allowed four clock cycles to propagate through the three levels of multiplexers, each beginning at a different clock cycle.

When the Trdylrdy signal is high, multiplexer 60 of FIG. 4A supplies an output signal at each clock cycle. When it does so, an output from one of multiplexer 52 and multiplexer 54, alternately, then supplies an output to the multiplexer 60. When one of multiplexer 52 and multiplexer 54 then supplies an output to the multiplexer 60, one of multiplexers 44 and 46, or 48 and 50, respectively and in turn, then supplies the multiplexer 52 or 54. After a multiplexer 44, 46, 48 or 50 supplies one of the multiplexers 52 or 54, its associated bank read pointer 34, 36, 38 or 40, respectively, triggers the multiplexer 44, 46, 48 or 50, to increment to the next of the four registers to await output of the 32-bit data string stored therein.

These four, two-bit wide multiplexers 44, 46, 48 and 50 are thus ultimately driven or triggered by the four-bit wide current read pointer CURP, and decode a special binary pattern. For example, the bank zero read pointer 40 first drives out one of the four 32-bit data strings of bank zero 30, e.g., the zeroeth register, when the CURP is 0. Next, the B1RP 42 drives out a data string of bank one 32, i.e., the first register, when the CURP is 1. Next, the B2RP 44 drives out a data string of bank two 34, i.e., the second register, when the CURP is 2. Next, the B3RP 46 drives out a data string of bank three 36, i.e., the third register, when the CURP is 3. The next data string of bank zero 30, i.e., the fourth register, is next driven out by the BORP 40, when the CURP is 4, and the stream continues.

The four, two-bit wide bank read pointers 32, 34, 36 and 40, each count once every four clock cycles. This means that data has four PCI clock periods to reach the final stage multiplexer 60. The next level of multiplexers 52 and 54 after the first level of multiplexers 44, 46, 48 and 50 which receive data from bank read pointers 34, 36, 38 and 40, respectively, are driven by an odd pointer 56 and an even pointer 58, respectively. The even pointer 58 selects either bank zero 30 or bank two 26, after which data will be output to the final stage multiplexer 60, and the odd pointer 56 selects either bank one 28 or bank three 24, after which data will be output to the final stage multiplexer 60. The two, single-bit wide pointers 56 and 58 change states every two PCI clock periods.

The last stage multiplexer 60 is driven by the least significant bit of the FIFO read pointer. The FIFO read pointer selects either even bank data (28 or 30) or odd bank data (24 or 26) to be output to the package pin.

Figure 6:
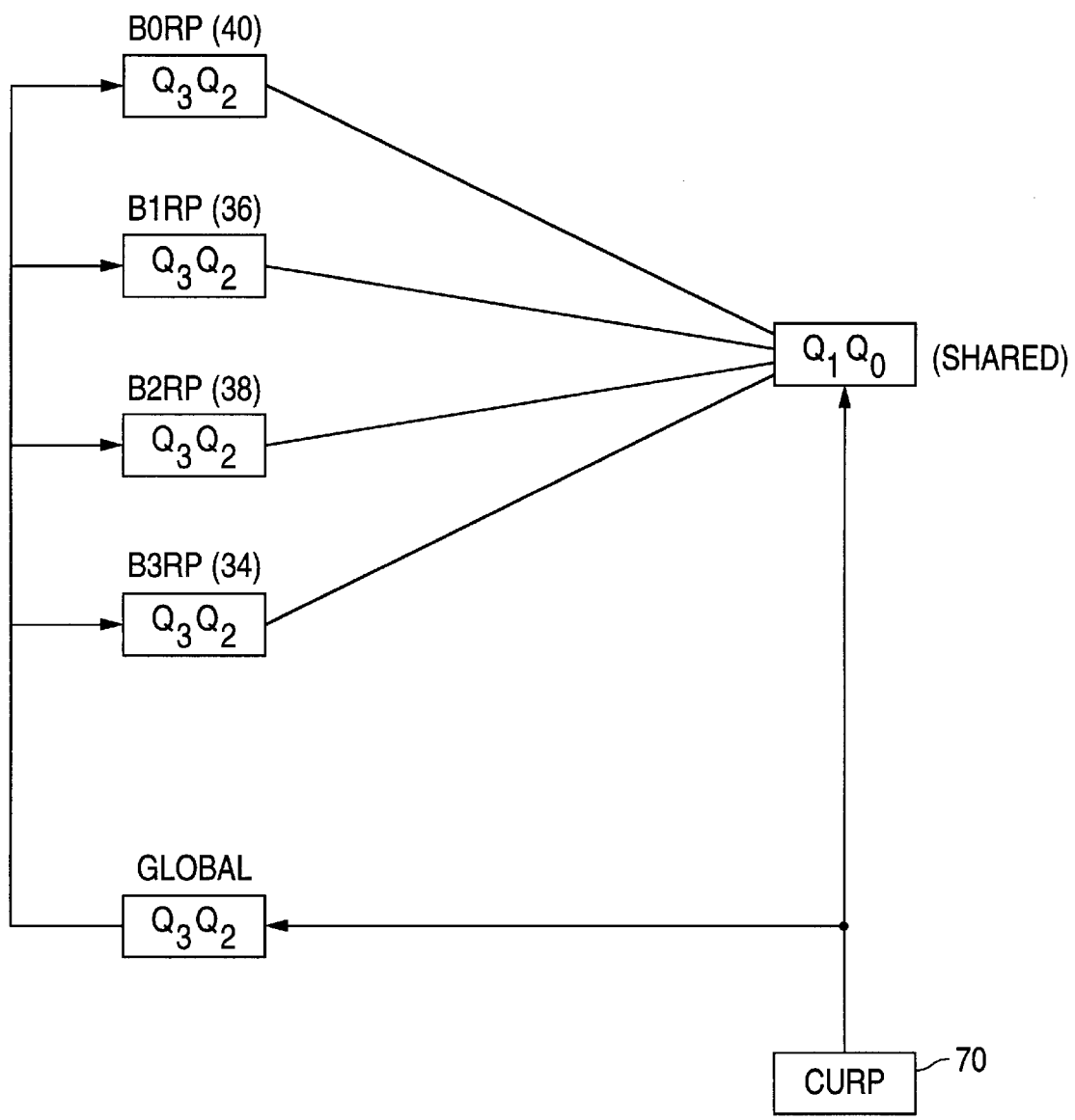
FIG. 6 shows conceptually how the $Q_1Q_0$ are shared by the four bank read pointers B0RP, B1RP, B2RP and B3RP, and the current read pointer includes one of the four bank read pointers.

FIG. 6 shows conceptually how the $Q_1Q_0$ are shared by the four bank read pointers B0RP, B1RP, B2RP and B3RP, and the current read pointer includes one of the four bank read pointers. A global read pointer is shown for conceptual purposes, wherein the four banks 24, 26, 28 and 30 are treated as a single bank of registers. At each clock cycle, the CURP 70 becomes a different one of the four bank read pointers 34, 36, 38 and 40. Since each one of the four bank read pointers 34, 36, 38 and 40 has four clock cycles to point to one of the registers of its associated bank 24, 26, 28 and 30, respectively, the value of the currently pointed to register is in turn output quickly.

What is claimed is:

1. A FIFO architecture, comprising:
   a first FIFO stack including first and second subarrays of registers;
   a second FIFO stack including third and fourth subarrays of registers;
   first, second, third and fourth multiplexers for receiving output from the first, second, third and fourth subarrays, respectively, and for outputting the same;
   first, second, third and fourth read pointers associated with said first, second, third and fourth subarrays, respectively;
   a fifth multiplexer connected to each of the first and second multiplexers and receiving output from the first FIFO stack via the first and second multiplexers;
   a sixth multiplexer connected to each of the third and fourth multiplexers and receiving output from the second FIFO stack via the third and fourth multiplexers; and
   a seventh multiplexer connected to each of the fifth and sixth multiplexers and receiving output from both the first and second FIFO stacks via the fifth and sixth multiplexers, respectively.

2. The FIFO architecture of claim 1, wherein, during each clock cycle, each of the first, second, third and fourth multiplexers sequentially outputs data from one of four registers of the subarray from which the data are received.

3. The FIFO architecture of claim 2, wherein data is held in each of the first, second, third and fourth multiplexers for four clock cycles.

4. The FIFO architecture of claim 1, wherein, during each clock cycle, each of the fifth and sixth multiplexers sequentially outputs data from one of the two multiplexers of the first, second, third and fourth multiplexers from which the data are received.

5. The FIFO architecture of claim 4, wherein data is held in each of the fifth and sixth multiplexers for two clock cycles.

6. The FIFO architecture of claim 5, wherein data is held in said each of the fifth and sixth multiplexers for only two clock cycles.

7. The FIFO architecture of claim 1, wherein, during each clock cycle, the seventh multiplexer outputs data from one of the fifth and sixth multiplexers from which the data are received.

8. The FIFO architecture of claim 7, wherein data is held in said seventh multiplexer for one clock cycle.

9. The FIFO architecture of claim 8, wherein data is held in said seventh multiplexer for only one clock cycles.

10. The FIFO architecture of claim 1, wherein each of the fifth, sixth and seventh multiplexers is a single-bit multiplexer.

11. A four-way interleaved FIFO architecture, comprising:
    an odd-pointer FIFO including first and second subarrays of registers;
    an even-pointer FIFO including third and fourth subarrays of registers;
    an odd read pointer associated with said odd-pointer FIFO;
    an even read pointer associated with said even-pointer FIFO;
    first and second multiplexers for receiving data from said first and second subarrays of said odd-pointer FIFO, respectively;
    third and fourth multiplexers for receiving data from said third and fourth subarrays of said even-pointer FIFO, respectively;
    a fifth multiplexer for receiving odd FIFO data from each of said first and second multiplexers, alternately;
    a sixth multiplexer for receiving even FIFO data from each of said third and fourth two-bit multiplexers, alternately;
    a seventh multiplexer for receiving data from each of said first and second single-bit multiplexers, alternately, and for outputting the FIFO memory apparatus, wherein
    said fifth multiplexer, for receiving and outputting said odd FIFO data, is controlled by a first clock signal, and
    said sixth multiplexer, for receiving and outputting said even FIFO data, is controlled by a second clock signal.

12. The FIFO architecture of claim 11, wherein the seventh multiplexer outputs different data each clock cycle.

13. The FIFO architecture of claim 12, wherein the seventh multiplexer outputs odd-pointer FIFO data and even-pointer FIFO data, alternately, incrementally by two and cyclically, every other clock cycle.

14. The FIFO architecture of claim 11, wherein said seventh multiplexer is a single-bit multiplexer.

15. A FIFO architecture, comprising:
    an array of registers including a plurality of stacked subarrays;
    a plurality of read pointers each associated with a different one of said plurality of stacked subarrays;
    a first plurality of multiplexers each for receiving data from one of the subarrays;
    a second plurality of multiplexers each for receiving data from two of the first plurality of multiplexers; and
    an output multiplexer for supplying an output for the FIFO memory and for receiving data from only two of said second plurality of multiplexers.

16. The FIFO architecture of claim 15, wherein each of the second plurality of multiplexers supplies the output multiplexer.

17. The FIFO architecture of claim 15, wherein each of the first plurality of multiplexers is a two-bit multiplexer, and each of the second plurality of multiplexers and the output multiplexer is a single-bit multiplexer.

18. A FIFO architecture, comprising:
an array of registers arranged into a plurality of subarrays;
a plurality of read pointers each associated with a different one of said plurality of subarrays;
a first plurality of multiplexers, each of said first plurality of multiplexers for receiving an output from one of the plurality of subarrays;
a second plurality of multiplexers, each having only two inputs, one of said second plurality of multiplexers for outputting said FIFO architecture.

19. The FIFO architecture of claim 18, wherein each input of said only two inputs is connected to an output of another multiplexer.

20. The FIFO architecture of claim 19, wherein only two other multiplexers supply outputs to each of said second plurality of multiplexers.

21. The FIFO architecture of claim 18, wherein each of said first plurality of multiplexers is a two-bit multiplexer and each of said second plurality of multiplexers is a single-bit multiplexer.

22. A FIFO architecture, comprising:
a first FIFO memory;
a second FIFO memory;
a first read pointer associated with said first FIFO memory;
a second read pointer associated with said second FIFO memory;
a first pair of multiplexers for receiving the output of the first FIFO memory;
a second pair of multiplexers for receiving the output of the second FIFO memory;
a third pair of multiplexers, one multiplexer of said third pair for receiving the output of said first pair and the other multiplexer of said third pair for receiving the output of said second pair; and
an output multiplexer for receiving an output from each one of said third pair of multiplexers, alternately, and for supplying an output for the FIFO memory,
wherein said output multiplexer is a single-bit multiplexer.

23. The FIFO architecture of claim 22, wherein the first and second FIFO memories comprise sequentially-ordered odd and even pointer addresses, respectively, for sequential output by said output multiplexer.

24. The FIFO architecture of claim 22, wherein data is held by said output multiplexer for only one clock cycle.

25. The FIFO architecture of claim 22, wherein the third pair of multiplexers and the output multiplexer each comprise only two-to-one multiplexers.

26. The FIFO architecture of claim 22, wherein each said multiplexer of said third pair of multiplexers outputs data every two clock cycles to said output multiplexer.

27. The FIFO architecture of claim 26, wherein said output multiplexer outputs the same data received from said third pair of multiplexers in one cycle.

28. A method of decoding a FIFO memory array of a FIFO architecture including at least one read pointer associated with said array using a plurality of multiplexers, comprising the steps of:
arranging the array into a plurality of subarrays;
arranging all but one of the plurality of multiplexers into pairs of multiplexers, said one for supplying an output for the FIFO array;
outputting each subarray to one of the plurality of multiplexers;
outputting each pair of multiplexers to a different one of the plurality of multiplexers; and
outputting said one of the plurality of multiplexers for supplying an output for the FIFO array.

29. The method of claim 28, further comprising the steps of selecting a two-bit multiplexer as each said multiplexer which receives said output from each said subarray, and selecting a single-bit multiplexer as each said multiplexer which receives said output from each said pair of multiplexers.

30. The method of claim 28, further comprising the step of outputting one multiplexer, of said pair of multiplexers outputting to said one multiplexer for supplying the output of said FIFO array, each clock cycle.

31. The method of claim 28, further comprising the step of outputting said one multiplexer for supplying the output of said FIFO array each clock cycle.

32. The method claim 31, further comprising the step of outputting each multiplexer, of said pair of multiplexers outputting to said one multiplexer for supplying said output of said FIFO memory every two clock cycles.

33. The method of claim 28, further comprising the step of outputting each multiplexer, of said pair of multiplexers outputting to said one multiplexer for supplying said output of said FIFO memory every two clock cycles.

34. The method of claim 28, further comprising the step of holding data received by said one multiplexer for supplying the output of said FIFO for less than two clock cycles before outputting said data.

35. The method of claim 28, further comprising the steps of:
outputting each multiplexer, receiving output from one of said plurality of subarrays, every four clock cycles;
outputting each multiplexer, supplying said one multiplexer for supplying an output for said FIFO, every two clock cycles; and
outputting said one multiplexer, for supplying an output for said FIFO, every clock cycle.

36. The method of claim 28, further comprising the steps of:
supplying a first control signal to one multiplexer of said pair of multiplexers outputting to said one multiplexer for supplying said output for said FIFO; and
supplying a second control signal to the other multiplexer of said pair of multiplexers outputting to said one multiplexer for supplying said output for said FIFO.

37. The method of claim 28, further comprising the steps of:
arranging each of said plurality of subarrays to include only one of even pointer data and odd pointer data; and
supplying each multiplexer of each pair of multiplexers with only one of said even pointer data and said odd pointer data.

38. The method of claim 37, further comprising the steps of:
supplying a first control signal to each multiplexer receiving and outputting only even pointer data; and
supplying a second control signal to each multiplexer receiving and outputting,only odd pointer data.

39. The method of claim 28, further comprising the step of providing said one multiplexer for supplying said output of said FIFO memory with only two inputs.

40. The method of claim 28, further comprising the step of connecting said one multiplexer for supplying said output of said FIFO memory to only two other multiplexers.

41. The method of claim 28, further comprising the step of outputting only two other multiplexers to said one multiplexer for supplying said output of said FIFO memory.

42. A FIFO architecture, comprising:

a plurality of data banks each including a plurality of registers having data stored therein; and a plurality of read pointers each associated with a different one of said plurality of data banks and pointing to a first register of its associated data bank, wherein a first read pointer changes to point to a second register of its associated data bank after a first clock cycle, and wherein data stored in one of said plurality of registers of a first data bank is output during said first clock cycle.

43. The FIFO architecture of claim 42, wherein said first read pointer changes to point to said second register after pointing to said first register for more than one clock cycle.

44. The FIFO architecture of claim 43, wherein a number of clock cycles that said first read pointer points to said first register before changing to point to said second register is equal to a total number of said plurality of read pointers.

45. The FIFO architecture of claim 44, wherein said total number is four.

46. The FIFO architecture of claim 42, wherein a second read pointer changes to point to a second register of its associated data bank after a second clock cycle, and wherein data stored in one of said plurality of registers of a second data bank is output during said second clock cycle.

47. The FIFO architecture of claim 46, wherein a third read pointer changes to point to a second register of its associated data bank after a third clock cycle, and wherein data stored in one of said plurality of registers of a third data bank is output during said third clock cycle.

48. The FIFO architecture of claim 47, wherein a fourth read pointer changes to point to a second register of its associated data bank after a fourth clock cycle, and wherein data stored in one of said plurality of registers of a fourth data bank is output during said fourth clock cycle.

* * * * *